United States Patent [19]

Thomas et al.

[11] Patent Number: 5,055,773
[45] Date of Patent: Oct. 8, 1991

[54] DETECTION AND MEASUREMENT OF A DC COMPONENT IN AN AC WAVEFORM

[75] Inventors: Lloyd S. Thomas, Gordon; Evan J. Stanbury, Lakemba, both of Australia

[73] Assignee: Alcatel N.V., Amsterdam, Netherlands

[21] Appl. No.: 511,352

[22] Filed: Apr. 17, 1990

[30] Foreign Application Priority Data

Apr. 18, 1989 [AU] Australia .................................. PJ3736

[51] Int. Cl.⁵ .......................... G01R 29/00; H03K 3/29
[52] U.S. Cl. ................................. 324/132; 324/103 P; 324/111; 307/351
[58] Field of Search ............... 324/115, 132, 142, 111, 324/103 P; 364/483, 492; 361/86, 94, 80; 307/351; 328/151, 150

[56] References Cited

U.S. PATENT DOCUMENTS

| | | | |
|---|---|---|---|
| 3,257,616 | 6/1966 | Andrushkiw et al. | 324/132 |
| 3,973,197 | 8/1976 | Meyer | 324/103 P |
| 4,166,245 | 8/1979 | Roberts | 324/103 P |
| 4,459,546 | 7/1984 | Arrington et al. | 324/142 |
| 4,746,816 | 5/1988 | Olesen | 307/351 |
| 4,943,766 | 7/1990 | Suzuki | 324/132 |
| 5,003,196 | 3/1991 | Kawaguchi | 307/351 |

*Primary Examiner*—Kenneth A. Wieder
*Assistant Examiner*—Vinh P. Nguyen
*Attorney, Agent, or Firm*—Christie, Parker & Hale

[57] ABSTRACT

DC offset is measured by separating the positive and negative half cycles of the AC waveform, obtaining a measure of the energy content of each type of half cycle and subtracting one from the other and accumulating the result. The accumulated result is measured against a threshold which is selected to have a known relationship to the units used to measure the DC offset. Each time the threshold is exceeded, this increments a counter and at the same time resets the accumulator. The contents of the counter can then be multiplied by an appropriate scaling factor. The square root of this result gives a measure of DC offset.

3 Claims, 3 Drawing Sheets

DETECTION AND MEASUREMENT OF A DC COMPONENT IN AN AC WAVEFORM

TECHNICAL FIELD

This invention relates to a method and apparatus for detecting (and measuring) a DC component in an AC current.

One area where such a need arises is in the supply of electricity by a generating authority.

BACKGROUND ART

It is common for AC kWh meters to use current transformers to measure the current flowing into a load, from which the power may be derived by known means in conjunction with the measured voltage across the load.

Certain types of load containing half-wave rectifiers or triac-controlled devices may introduce a DC component to the current consumed, which may saturate the current transformer and reduce measurement accuracy. Some types of current transducer or processing circuitry may not pass DC levels. Thus some electricity consumers may obtain free power by this method. DC currents may cause saturation in distribution transformers, causing loss of efficiency, higher temperatures and reduced lifetime, as well as causing corrosion of water or gas pipes and ground rods, with consequent safety hazards, and maintenance costs.

DISCLOSURE OF INVENTION

This invention describes a method of detecting and measuring DC current flowing through the primary of a current transformer by measurements taken on the secondary. A hardware method is described, but the method may equally be applied using analogue or digital hardware or software. In particular, the software version may be implemented as a by-product of the $A^2h$ calculation. The method can be adapted to other transducers which isolate DC.

The method according to the invention comprises the steps of separating the positive and negative half-cycles, squaring the half-cycles and subtracting the squared negative pulses from the squared positive pulses or vice versa, accumulating (summing/integrating) the results, and detecting whether the accumulated result exceeds an upper (positive) or a lower (negative) threshold. The number of times a threshold is exceeded is counted and the accumulation process is restarted each time a threshold is exceeded. The count of the number of times a threshold is exceeded is a measure of the DC. This value may be multiplied by a scaling factor and the square root taken to provide a value for the DC.

The method may be implemented in analog (or digital) hardware or in a microprocessor controlled system incorporating digital hardware.

BRIEF DESCRIPTION OF DRAWINGS

The invention will be more fully described with reference to the accompanying drawings in which.

BEST MODE FOR CARRYING OUT THE INVENTION

Figure 1:
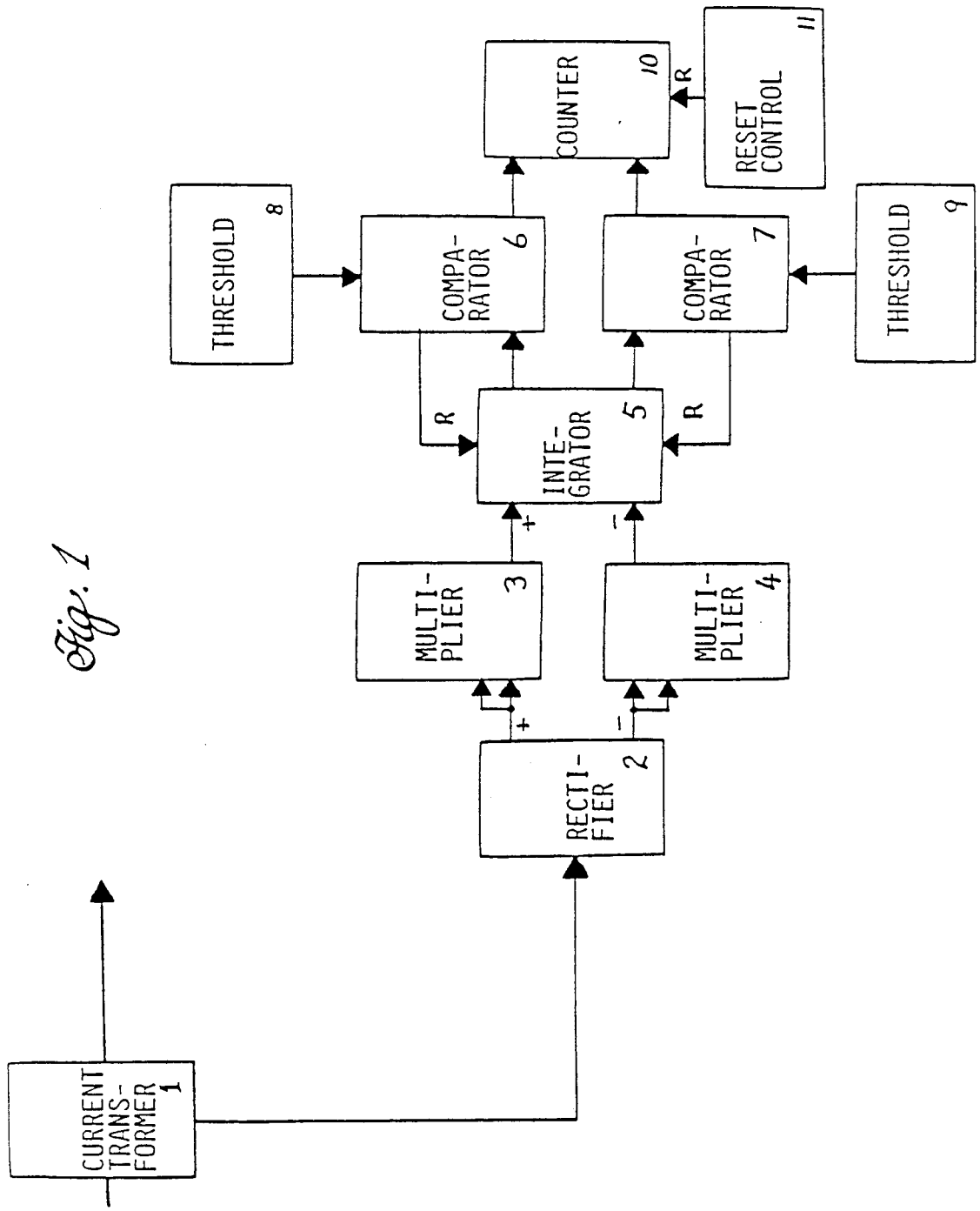
FIG. 1 is a block diagram of an embodiment of the invention.

With reference to FIG. 1, the current transformer 1 produces a current on its secondary proportional to the AC component of its primary current. The average current on the secondary is zero, when averaged over a large number of cycles. Rectifier 2 separates the positive and negative half-cycles, which are then squared at 3 and 4 and accumlated in integrator 5, one half-cycle causing the output of integrator 3 to increase, the other half-cycle causing the output of integrator 5 to decrease.

If the load current (primary CT current) consists of pure AC, the output of integrator 5 will increase and decrease by the same amount every cycle, causing no net effect.

If, however, a half-wave rectified load is attached, on half-cycle will dominate, and integrator 5 will move steadily up or down, depending on the DC current polarity.

Comparators 6 and 7 detect when the output of integrator 5 exceeds upper limit 8 or lower limit 9, respectively, and then reset integrator 5, as well as incrementing counter 10 which measures the magnitude of DC current.

The contents of register 10 may be read periodically (at the regular meter-reading time) to detect if DC is being consumed, upon which the electricity supplier may initiate appropriate measures. Moreover, the contents of the register may be multiplied by a scaling factor and the square root taken to provide a value for the DC. Register 10 may then optionally be manually reset by reset means 11 to start another measurement period. Alternatively, when the comparators show that DC is being consumed, an alarm may be raised at the electricity supply company, if the measuring device is connected to a suitable communication system.

The thresholds selected at 8 and 9 should be large enough so that DC is not indicated by the occasional switching on or off of heavy loads, which may result in a heavy current for half a cycle, effectively an instantaneous DC current.

Figure 3:
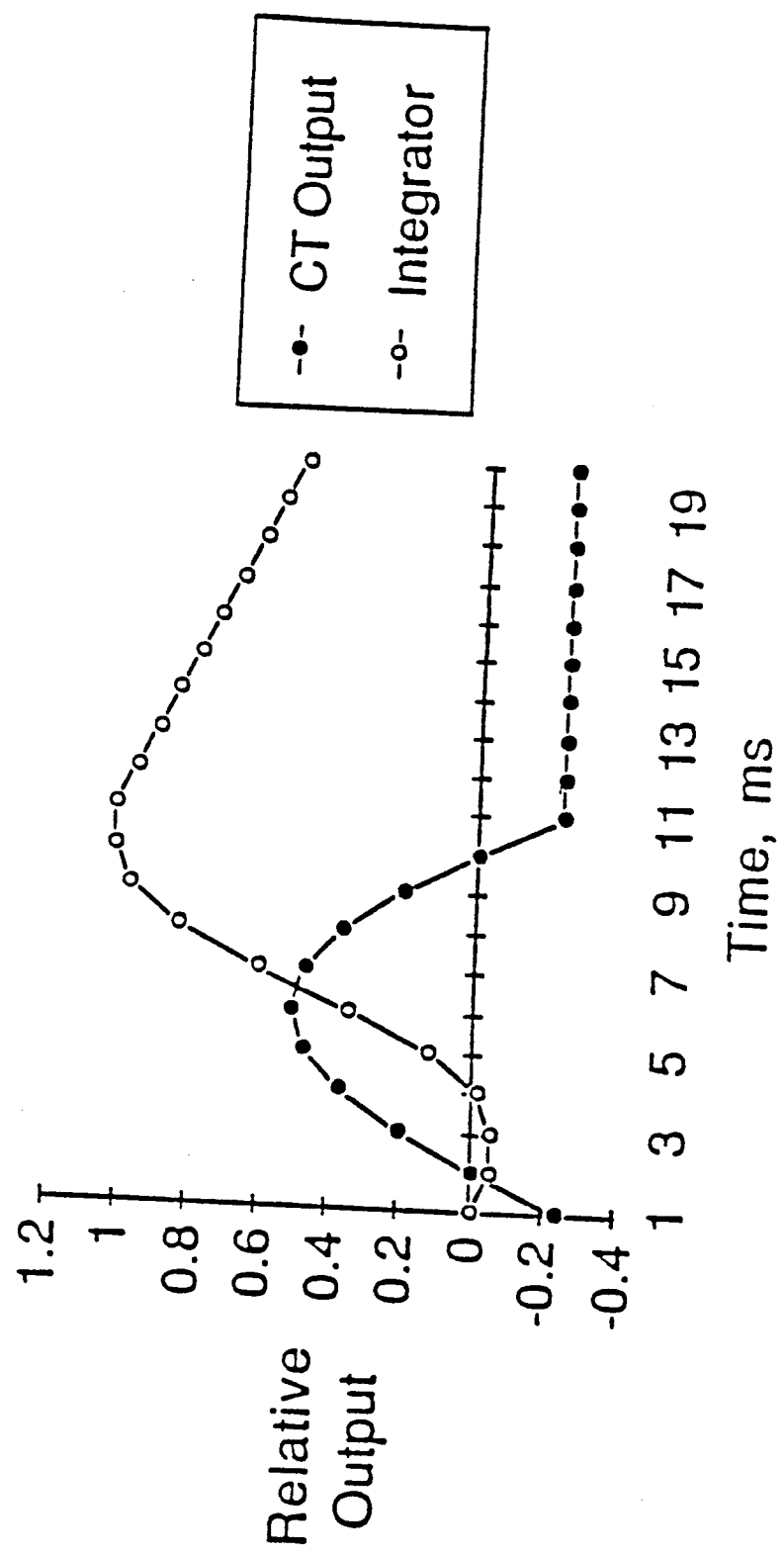
FIG. 3 is a current/time diagram showing the effect of squaring the current.

The attached graph (FIG. 3) shows the current transformer output current for one cycle of a 50 Hz waveform, where the load is half-wave rectified. The integration output shows an increase over the period of the AC cycle due to the DC component in the current.

This method may be implemented in a system including a microprocess programmed as follows (I is the transducer output, Sum is the output of integrator 5. Limit represents boxes 8 and 9 and DC is register 10).

| I = Current Sample | |
|---|---|
| IF | I > 0 |
| THEN | Sum = Sum + I*I |
| ELSE | Sum = Sum − I*I |
| IF | Sum > +Limit |
| THEN | Sum = Sum −Limit |
|  | DC = DC + 1 |
| ELSE IF | Sum < −Limit |
| THEN | Sum = SUM +Limit |
|  | DC = DC + 1 |

Figure 2:
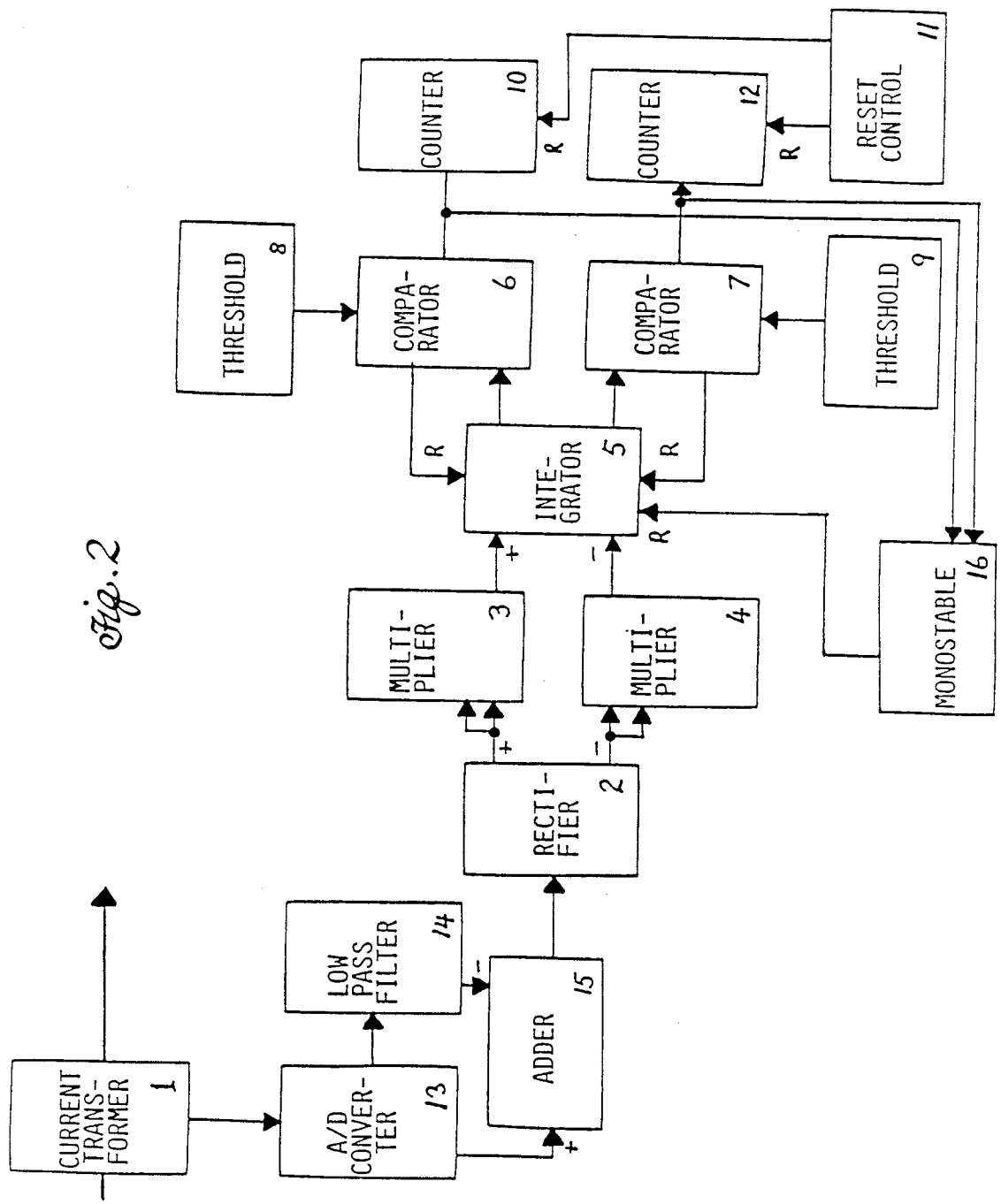
FIG. 2 is a block diagram of the embodiment of FIG. 1 with no-load offset correction.

FIG. 2 is the same as FIG. 1 with the addition of functions to eliminate a false DC current indication due to DC offsets in the circuitry, which could indicate DC consumption even under no-load conditions. A digital hardware implementation is assumed here, where the DC offset occurs only in the A/D converter 13.

Low-pass filter 14 measures the average output of the current transformer with a time constant of many cycles. This calculates the average DC offset of A/D converter 13, which is subtracted from the input signal by adder 15 to eliminate DC offset.

Monostable function 16 is re-triggered when a comparator (6 or 7) threshold is exceeded. If the monostable delay expires without a DC level exceeding the threshold, the integrator 5 will be reset. This will prevent a DC 'creep'. These methods using the low pass filter or the monostable may be used individually or separately.

If it is desirable to measure both the magnitude and polarity of DC consumed, the single register 10 may be replaced by two separate registers 10 and 12, one of which is incremented for positive DC, the other for negative DC consumption.

Because current is squared, the output will be proportional to DC current squared, and thus penalise occasional heavy DC current consumption more than slight continuous consumption.

An electricity-measuring device which calculates Amps-squared hours ($A^2h$, a measure relating to transmission losses) is required to measure the square of instantaneous current, and the DC detection of the present invention may be implemented as a by-product of this calculation.

While the present invention has been described with regard to many particulars, it is to be understood that equivalents may be readily substituted without departing from the scope of the invention.

We claim:

1. A method of detecting a DC component in an AC waveform, comprising the steps of:
    separating the AC waveform into positive and negative half-cycle pulses,
    squaring each of the half-cycle pulses, accumulating the difference of the squared negative pulses and the squared positive pulses to form an accumulated difference, and
    detecting when the accumulated difference exceeds an upper or a lower threshold.

2. The method of claim 1, further comprising the steps of:
    counting each occurrence of the accumulated result exceeding a threshold to form a count corresponding to a value for the DC, and
    restarting the accumulation process by reinitializing said accumulated difference each time the threshold is exceeded
    whereby DC in an AC waveform may be measured.

3. A method as claimed in claim 2, including the step of multiplying the count by a scaling factor and taking the square root to obtain a weighted average DC current.

* * * * *